(12) United States Patent
Takemoto

(10) Patent No.: US 12,119,843 B2
(45) Date of Patent: Oct. 15, 2024

(54) ENCODER AND DECODER

(71) Applicant: Kioxia Corporation, Tokyo (JP)

(72) Inventor: Takashi Takemoto, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 46 days.

(21) Appl. No.: 18/178,437

(22) Filed: Mar. 3, 2023

(65) Prior Publication Data

US 2023/0412190 A1 Dec. 21, 2023

(30) Foreign Application Priority Data

Jun. 17, 2022 (JP) .................... 2022-098430

(51) Int. Cl.
*H03M 7/30* (2006.01)
*G06F 3/06* (2006.01)

(52) U.S. Cl.
CPC ............ *H03M 7/30* (2013.01); *G06F 3/0608* (2013.01); *G06F 3/064* (2013.01); *G06F 3/0679* (2013.01)

(58) Field of Classification Search
CPC ..... H03M 7/30; H03M 7/3079; G06F 3/0608; G06F 3/064; G06F 3/0679; H04N 19/13
See application file for complete search history.

(56) References Cited

U.S. PATENT DOCUMENTS

| | | | |
|---|---|---|---|
| 5,635,938 A | 6/1997 | Komoto | |
| 6,026,198 A | 2/2000 | Okada | |
| 7,791,510 B2 | 9/2010 | Maeda | |
| 9,148,172 B2 | 9/2015 | Manning et al. | |
| 2011/0206131 A1* | 8/2011 | Vafin | H03M 7/40 704/207 |
| 2020/0413106 A1 | 12/2020 | Gladding et al. | |
| 2023/0284982 A1* | 9/2023 | Dewald | A61B 5/0006 |
| 2023/0353765 A1* | 11/2023 | Mandt | H04N 19/42 |

OTHER PUBLICATIONS

Wikipedia: "Asymmetric numeral systems," Last Edited Oct. 20, 2022, 10 pages. Retrieved Nov. 28, 2022 from URL: https://en.wikipedia.org/wiki/Asymmetric_numeral_systems.

* cited by examiner

*Primary Examiner* — Jason W Blust

(74) *Attorney, Agent, or Firm* — Kim & Stewart LLP

(57) ABSTRACT

An entropy code encoder includes a register and first, second, third, and fourth arithmetic circuits. The first arithmetic circuit is configured to output, based on an input symbol, a first value corresponding to an appearance frequency of the input symbol and a second value corresponding to a cumulative distribution of the first value. The second arithmetic circuit is configured to output a third value corresponding to division of a value of bits in the register by the first value. The third arithmetic circuit is configured to output a fourth value obtained by adding the second value to a bit-shifted value of the third value, to update a value in the register. The fourth arithmetic circuit is configured to compare the value of upper bits in the register and the first value and output a value of lower bits in the register as a compressed data stream.

21 Claims, 8 Drawing Sheets

FIG. 8

| SYMBOL s | VALUE ss | OUTPUT OF CDF[4i] | OUTPUT OF CDF[ODD] | OUTPUT OF CDF[4i+2] | CDF0 | CDF1 | CDF2 | f[s] |
|---|---|---|---|---|---|---|---|---|
| 0 | 0 | CDF[0] | CDF[1] | CDF[2] | CDF[0] | CDF[1] | CDF[2] | CDF[1]-CDF[0] |
| 1 | 0 | CDF[0] | CDF[1] | CDF[2] | CDF[0] | CDF[1] | CDF[2] | CDF[2]-CDF[1] |
| 2 | 2 | CDF[4] | CDF[3] | CDF[2] | CDF[2] | CDF[3] | CDF[4] | CDF[3]-CDF[2] |
| 3 | 2 | CDF[4] | CDF[3] | CDF[2] | CDF[2] | CDF[3] | CDF[4] | CDF[4]-CDF[3] |
| 4 | 4 | CDF[4] | CDF[5] | CDF[6] | CDF[4] | CDF[5] | CDF[6] | CDF[5]-CDF[4] |
| 5 | 4 | CDF[4] | CDF[5] | CDF[6] | CDF[4] | CDF[5] | CDF[6] | CDF[6]-CDF[5] |
| 6 | 6 | CDF[8] | CDF[7] | CDF[6] | CDF[6] | CDF[7] | CDF[8] | CDF[7]-CDF[6] |
| 7 | 6 | CDF[8] | CDF[7] | CDF[6] | CDF[6] | CDF[7] | CDF[8] | CDF[8]-CDF[7] |
| 8 | 8 | CDF[8] | CDF[9] | CDF[10] | CDF[8] | CDF[9] | CDF[10] | CDF[9]-CDF[8] |
| 9 | 8 | CDF[8] | CDF[9] | CDF[10] | CDF[8] | CDF[9] | CDF[10] | CDF[10]-CDF[9] |
| 10 | 10 | CDF[12] | CDF[11] | CDF[10] | CDF[10] | CDF[11] | CDF[12] | CDF[11]-CDF[10] |
| 11 | 10 | CDF[12] | CDF[11] | CDF[10] | CDF[10] | CDF[11] | CDF[12] | CDF[12]-CDF[11] |

ENCODER AND DECODER

CROSS-REFERENCE TO RELATED APPLICATION(S)

This application is based upon and claims the benefit of priority from Japanese Patent Application No. 2022-098430, filed Jun. 17, 2022, the entire contents of which are incorporated herein by reference.

FIELD

Embodiments described herein relate generally to an encoder and a decoder provided in a memory system including a non-volatile memory.

BACKGROUND

Recently, a memory system including a non-volatile memory is widespread. A solid state drive (SSD) including a NAND flash memory is known as one type of the memory system.

In the above memory system, an arithmetic encoding and decoding method is used in which data is encoded and decoded while sequentially updating an encoding table and a decoding table. A technique for implementing this method in hardware is required.

BRIEF DESCRIPTION OF THE DRAWINGS

FIG. 8 is a diagram illustrating an example of a selector output according to the fifth embodiment.

DETAILED DESCRIPTION

Figure 1:
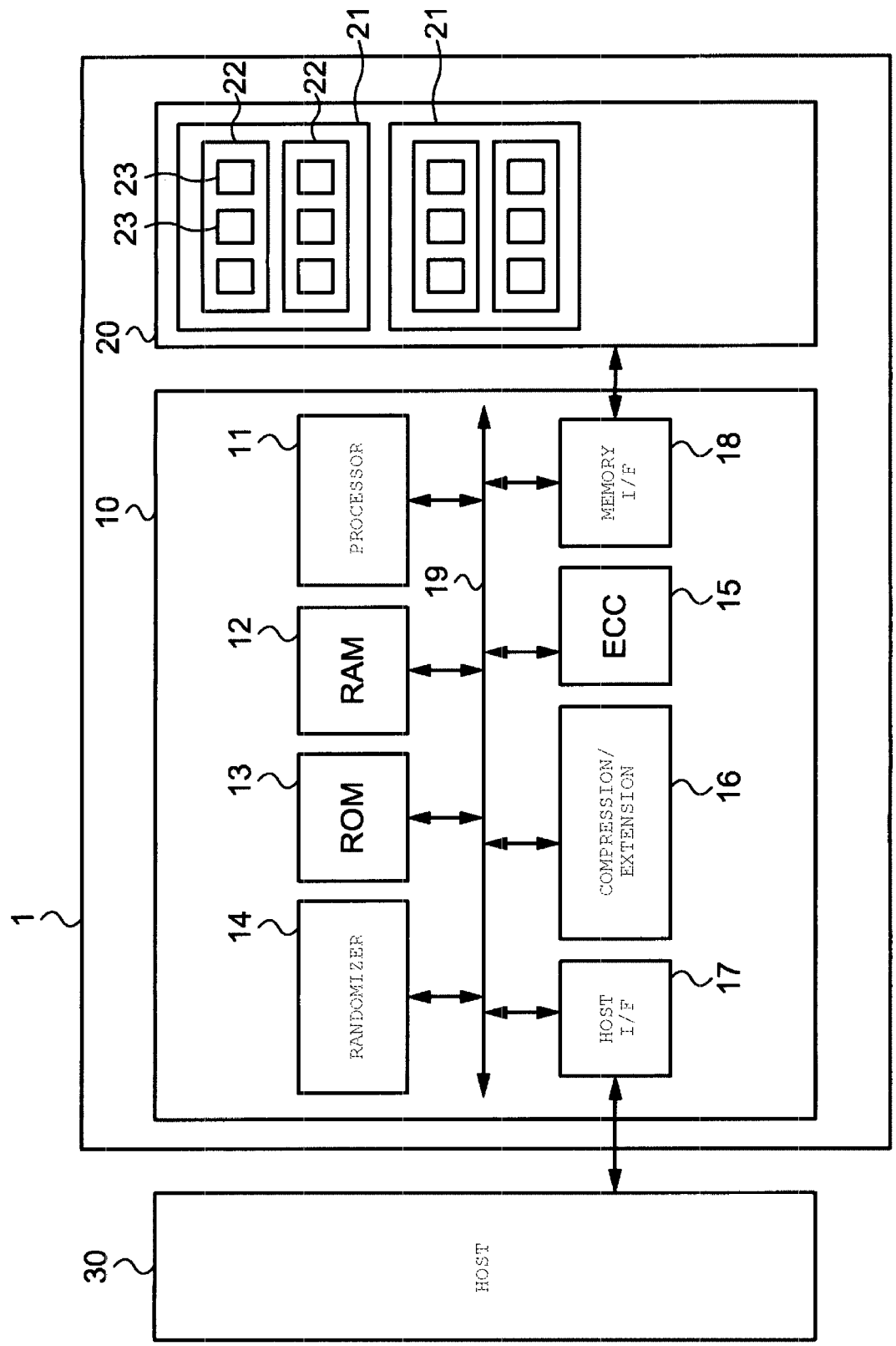
FIG. 1 is a block diagram illustrating a configuration of a memory system according to a first embodiment.

Embodiments provide an encoder and a decoder of a memory system that increase processing speeds of encoding and decoding.

In general, according to an embodiment, an entropy code encoder includes a register and first, second, and third arithmetic circuits. The first arithmetic circuit is configured to output, based on an input symbol to be compressed, a first value corresponding to an appearance frequency of the input symbol and a second value corresponding to a cumulative distribution of the first value. The second arithmetic circuit is configured to output a third value corresponding to division of a value of bits stored in the register by the first value. The third arithmetic circuit is configured to output a fourth value obtained by adding the second value to a bit-shifted value of the third value to the register, to update a value of bits stored in the register to the fourth value. The fourth arithmetic circuit is configured to compare the value of the upper bits stored in the register and the first value and output a value of lower bits stored in the register as a compressed data stream in accordance with a comparison result.

Hereinafter, memory systems according to embodiments will be specifically described with reference to the drawings. In the following description, elements having substantially the same function and configuration are designated by the same reference numerals, and redundant descriptions thereof may be omitted. Each of the following embodiments exemplifies devices and methods for embodying the technical idea of the embodiments. The technical idea of the embodiments is not limited to a material of an element, a shape, a structure, a disposition, and the like below. The technical idea of the embodiments may be changed by adding various modifications to the scope of claims.

In the following description, data input to an encoder for compression and data output after the compressed data is extended by a decoder are referred to as a "symbol" or "data symbol". A symbol input to an encoding unit of a compression/extension circuit 16 is called an "input symbol" or "input data symbol". A symbol output from a decoding unit of the compression/extension circuit 16 is called an "output symbol" or "output data symbol". When there is no need to distinguish between the "input symbol" and the "output symbol" in particular, the "input symbol" and the "output symbol" are simply referred to as a "symbol".

"Compressing" means reducing the amount of information (for example, the number of bits) of a data string of a target and may also be referred to as "encoding" or "performing encode processing". "Extending" means restoring the amount of information of a compressed data string to a state before compression and may also be referred to as "decompression," "decoding," or "performing decode processing". A "compressed stream" means a compressed data string.

In the encode processing and the decode processing, an "internal state" means the part of numerical information which is stored in an encoder or a decoder when a symbol string is converted into corresponding numerical information by arithmetic encoding. That is, the internal state indicates states of the encoder and the decoder. A part of the internal state is output as a compressed stream or an output symbol. "Left shift" means bit-shifting target data to an upper bit side, and "right shift" means bit-shifting target data to a lower bit side.

1. First Embodiment

A memory system according to a first embodiment will be described. The memory system according to the first embodiment includes, for example, a NAND flash memory as a semiconductor storage device and a memory controller for controlling the NAND flash memory. In the present embodiment, the memory controller has a function of compressing and extending data.

1-1. Overall Configuration of Memory System 1

FIG. 1 is a block diagram illustrating a configuration of a memory system according to the first embodiment. As illustrated in FIG. 1, a memory system 1 includes a memory controller 10 and a non-volatile memory 20 including a plurality of memory cells. The memory system 1 can be connected to a host 30. FIG. 1 illustrates a state in which the memory system 1 is connected to the host 30. The host 30 is an electronic device, such as a personal computer or a mobile terminal.

The non-volatile memory 20 includes a plurality of memory chips 21. The memory controller 10 controls each of the plurality of memory chips 21. Specifically, the memory controller 10 performs a data write operation and a data read operation for each of the memory chips 21. Each of the plurality of memory chips 21 is connected to the memory controller 10 through a NAND bus. Each of the memory chips 21 includes a plurality of dies 22. A die 22 means a wafer unit on which memory cells are formed. The memory chip 21 has a plurality of stacked dies 22. A plurality of memory blocks 23 is provided in each of the dies 22. The memory block 23 is a unit that can be erased collectively. All memory cell transistors provided in the memory block 23 are connected to the same source line. One unit of the memory block 23 may be referred to as a "physical block". The memory block 23 includes a plurality of pages. Further, a memory cell transistor, which is a minimum unit of a memory element, may be simply called a "memory cell". A position of a memory cell in a physical block may be called a "physical address".

The non-volatile memory 20 is a non-volatile memory that stores data in a non-volatile manner, and is, for example, a NAND flash memory (hereinafter, simply referred to as a NAND memory). In the following description, a case where a NAND memory is used as the non-volatile memory 20 is exemplified, but a semiconductor storage device other than the NAND memory, such as a three-dimensional structure flash memory, a resistance random access memory (ReRAM), or a ferroelectric random access memory (FeRAM), may be used as the non-volatile memory 20. It is not essential that the non-volatile memory 20 is a semiconductor storage device. The present embodiment is applicable to various storage media other than the semiconductor storage device.

The memory system 1 may be a memory card or the like in which the memory controller 10 and the non-volatile memory 20 are configured as one package or may be a solid state drive (SSD) or the like.

The memory controller 10 is a semiconductor integrated circuit configured as, for example, a system-on-a-chip (SoC). Although part or all of operations of respective elements of the memory controller 10 to be described below are implemented by hardware, the operations may be performed by a central processing unit (CPU) executing firmware.

The memory controller 10 controls a write operation to write data into the non-volatile memory 20 according to a write request from the host 30 and controls a read operation to read data from the non-volatile memory 20 according to a read request from the host 30. The memory controller 10 includes a processor 11, a random access memory (RAM) 12, a read only memory (ROM) 13, a randomizer 14, an error correction code (ECC) circuit 15, a compression/extension circuit 16, a host interface 17, and a memory interface 18. The functional blocks are connected to each other by an internal bus 19.

The processor 11 is a control unit that collectively controls the respective functional blocks of the memory system 1. When receiving a request from the host 30 via the host interface 17, the processor 11 performs a control in accordance with the request. For example, the processor 11 instructs the memory interface 18 to perform a write operation of writing data into the non-volatile memory 20 according to a write request from the host 30. The processor 11 instructs the memory interface 18 to perform a read operation of reading data from the non-volatile memory 20 according to a read request from the host 30.

When receiving the write request from the host 30, the processor 11 determines a storage region (memory region) in the non-volatile memory 20 for data stored in the RAM 12. That is, the processor 11 manages a write destination of the data. A correspondence between a logical address of data received from the host 30 and a physical address indicating the storage region in the non-volatile memory 20 in which the data is stored is stored in an address mapping table. When performing a write operation in accordance with a write request, the processor 11 may store time when the write operation is performed or time from a certain reference time in a write time table of the RAM 12.

When receiving a read request from the host 30, the processor 11 converts a logical address designated by the read request into a physical address by using the above-described address mapping table and instructs the memory interface 18 to perform a read operation of reading data from the physical address.

A NAND memory generally performs the write operation and the read operation in a data unit called a "page", and performs erasing in a data unit of the above-described physical block. In the following description, the "page" means a minimum unit of the write operation. A plurality of memory cells connected to the same word line are referred to as a "memory cell group". When a memory cell is a single-level cell (SLC), one page includes one memory cell group. In a case of a multi-bit cell, such as a multi-level cell (MLC) including one memory cell group configuring two pages, a triple-level cell (TLC) including one memory cell group configuring three pages, or a quad-level cell (QLC) including one memory cell group configuring four pages, one memory cell group corresponds to a plurality of pages. Each memory cell is connected to both a word line and a bit line. Therefore, each memory cell can be identified by using an address for identifying the word line and an address for identifying the bit line.

The RAM 12 is used as, for example, a data buffer, and temporarily stores data received from the host 30 by the memory controller 10 until the received data is stored in the non-volatile memory 20. The RAM 12 temporarily stores data read from the non-volatile memory 20 until the read data is transmitted to the host 30. For example, a general-purpose memory, such as a static random access memory (SRAM) or a dynamic random access memory (DRAM), may be used as the RAM 12.

The ROM 13 stores various programs, various parameters, and the like for operating the memory controller 10. The programs, the parameters, and the like stored in ROM 13 are read into the processor 11 as needed.

The randomizer 14 includes, for example, a linear feedback shift register and the like, and generates a pseudo-random number uniquely obtained for an input seed value. For example, the processor 11 calculates an exclusive logical sum of the pseudo-random numbers generated by the randomizer 14 and write data. Thereby, the write data written into the non-volatile memory 20 is randomized. Further, the randomizer 14 cancels randomization of the data read from the non-volatile memory 20. By canceling the randomization, original data before randomization can be obtained from the randomized data.

The ECC circuit 15 performs ECC encoding (error correction encoding) during a write operation and ECC decoding (error correction decoding) during a read operation, based on an instruction from the processor 11. An encoding method using, for example, a low-density parity-check (LDPC) code, a Bose-Chaudhuri-Hocquenghem (BCH)

code, or a Reed-Solomon (RS) code, may be adopted as an encoding method of the ECC circuit 15.

The compression/extension circuit 16 operates as an encoding unit that compresses data to be written into the non-volatile memory 20. The compression/extension circuit 16 also operates as a decoding unit that extends data read from the non-volatile memory 20. A detailed description of the compression/extension circuit 16 will be given below.

The host interface 17 performs processing according to an interface standard between the host 30 and the host interface 17. The host interface 17 outputs a request received from the host 30, write target data, and the like to the internal bus 19. The host interface 17 reads data from the non-volatile memory 20 and transmits data extended by the compression/extension circuit 16 to the host 30. The host interface 17 transmits a response and the like from the processor 11 to the host 30.

The memory interface 18 performs a write operation to write data into the non-volatile memory 20 based on an instruction of the processor 11. The memory interface 18 performs a read operation to read data from the non-volatile memory 20 based on an instruction of the processor 11.

In the write operation of the memory system 1 including the configuration described above, the processor 11 instructs the compression/extension circuit 16 to compress data when a write operation with respect to the non-volatile memory 20 is performed. In this case, the processor 11 determines a storage location (storage address) of the write data in the non-volatile memory 20 and instructs the determined storage location to the memory interface 18. The compression/extension circuit 16 compresses data in the RAM 12 based on an instruction from the processor 11. Then, the randomizer 14 randomizes the compressed data in the RAM 12 based on an instruction from the processor 11. Then, the ECC circuit 15 further performs ECC encoding of the randomized data based on an instruction from the processor 11. The write data generated thereby is written to a designated storage location of the non-volatile memory 20 through the memory interface 18.

Meanwhile, in the read operation, the processor 11 designates an address in the non-volatile memory 20 during a read operation with respect to the non-volatile memory 20, and determines a condition of the read operation of the memory cell according to the designated address to instruct the memory interface 18 to perform the read operation. The processor 11 instructs the ECC circuit 15 to start ECC decoding, instructs the randomizer 14 to start cancellation of randomization, and instructs the compression/extension circuit 16 to start extension. The memory interface 18 performs a read operation for the designated address of the non-volatile memory 20 according to an instruction of the processor 11, and inputs the read data obtained by the read operation to the ECC circuit 15. The ECC circuit 15 performs ECC decoding of the input read data. The randomizer 14 cancels randomization for the ECC-decoded data. The compression/extension circuit 16 extends the data of which randomization is canceled. When the extension is successful, the processor 11 stores the extended original data in the RAM 12. Meanwhile, when the ECC decoding or the cancellation of randomization or the extension fails, the processor 11 notifies, for example, the host 30 of a read error.

1-2. Configuration of Entropy Encoding Device 40

The entropy encoding device 40 according to the first embodiment of the present disclosure will be described with reference to FIG. 2. This entropy encoding device 40 is disposed in the compression/extension circuit 16. The entropy encoding device 40 is a device in which a range variants asymmetric numeral system (rANS) method, which is one of arithmetic encoding methods, is implemented by hardware.

The entropy encoding device 40 performs encode processing (compression). The entropy encoding device 40 generates compressed stream OUT from an input symbol s. The entropy encoding device 40 is implemented by hardware so as to repeatedly perform the following calculation $C(x,s)$. The input symbol s is, for example, data that the compression/extension circuit 16 is instructed to compress from the processor 11. The generated compressed stream OUT is randomized by the randomizer 14 that received an instruction from, for example, the processor 11.

$$C(x,s) = (\text{floor}(x/f[s]) << n) + (x \% f[s]) + CDF[s]$$

x is an internal state value. s is an input symbol to be encoded. f[s] is a value obtained by multiplying an appearance probability of the symbol s by $2^n$ and has a length of n bits (n is a natural number). The appearance probability of the symbol s is represented as $f[s]/2^n$. floor means truncation. / is division. % is a remainder calculation (remainder of division). + is addition. CDF[s] is a cumulative distribution function of f[s] and is defined as follows.

$$CDF[s] = \sum_{i<s} f[i] = f[0] + f[1] + \cdots + f[s-1] \quad (1)$$

Since f[s] is a value obtained by multiplying an appearance probability of the symbol s by $2^n$ and is a value between 0 and $2^n$. Therefore, CDF[s] is monotonically incremental. The values of f[s] and CDF[s] for the input symbol s are calculated in advance and stored in one or more tables (Table 41 below). f[s] for the input symbol s may be referred to as "a value corresponding to an appearance frequency of the input symbol", for example, f[s] may be referred to as a "first value". CDF[s] for the input symbol s may be referred to as a "cumulative distribution value".

$C(x,s)$ is a function of an internal state x and the input symbol s, and this value is used as the next internal state x. That is, the entropy encoding device 40 repeatedly calculates $C(x,s)$.

A pseudocode used when a circuit for performing calculations defined by the above equations is mounted is as follows.

```
x = 0;
while(s = input=symbol( ) != EOF){//Input a symbol.
    if (x >= (f[s]<<(2*m − n))){//Does an overflow occur
    if the next symbol is taken-in to the state?
        output_stream(x, m);//Output the lower m bits of the
    state to the stream.
        x = x>>m;//Reduce the state.
    }
    x = ((x/f[s])<<n) + (x%f[s]) +CDF[s];//Update the state.
```

As shown in the above code, 0 is first set as the internal state x.

input_symbol( ) is a function representation for processing sequential taking-in of the input symbol s from an input symbol string. while (s=input_symbol( ) !=EOF) means repetition of processing until the input symbol string ends.

The processing to be repeated includes first processing and second processing as described below.

In the first processing, it is first determined whether the internal state x is greater than or equal to f[s]<<(2*m-n). f[s]<<(2*m-n) means bit-shifting of f [s] to the left by bits of a value obtained by subtracting n from 2*m, which is a bit length of x (m is a natural number). When the internal state x is greater than or equal to f[s]<<(2*m-n), the internal state x overflows when calculation is performed for the symbol s. Therefore, lower m bits of the internal state x are output as the compressed stream OUT. Then, x>>m is used as x. x>>m means bit-shifting of x to the right by m bits. By doing so, the internal state x is reduced by m bits.

In the second processing, x/f[s] is calculated. Since an integer division is performed for x/f[s], a floor function corresponding to truncation is implemented. At the same time, x % f[s] is calculated. x % f[s] means performing a remainder calculation. Then, x/f[s]<<n, x % f[s], and CDF [s] are added, and this is used as a new internal state x. x/f[s]<<n means bit-shifting of x/f[s] to the left by n bits.

Figure 2:
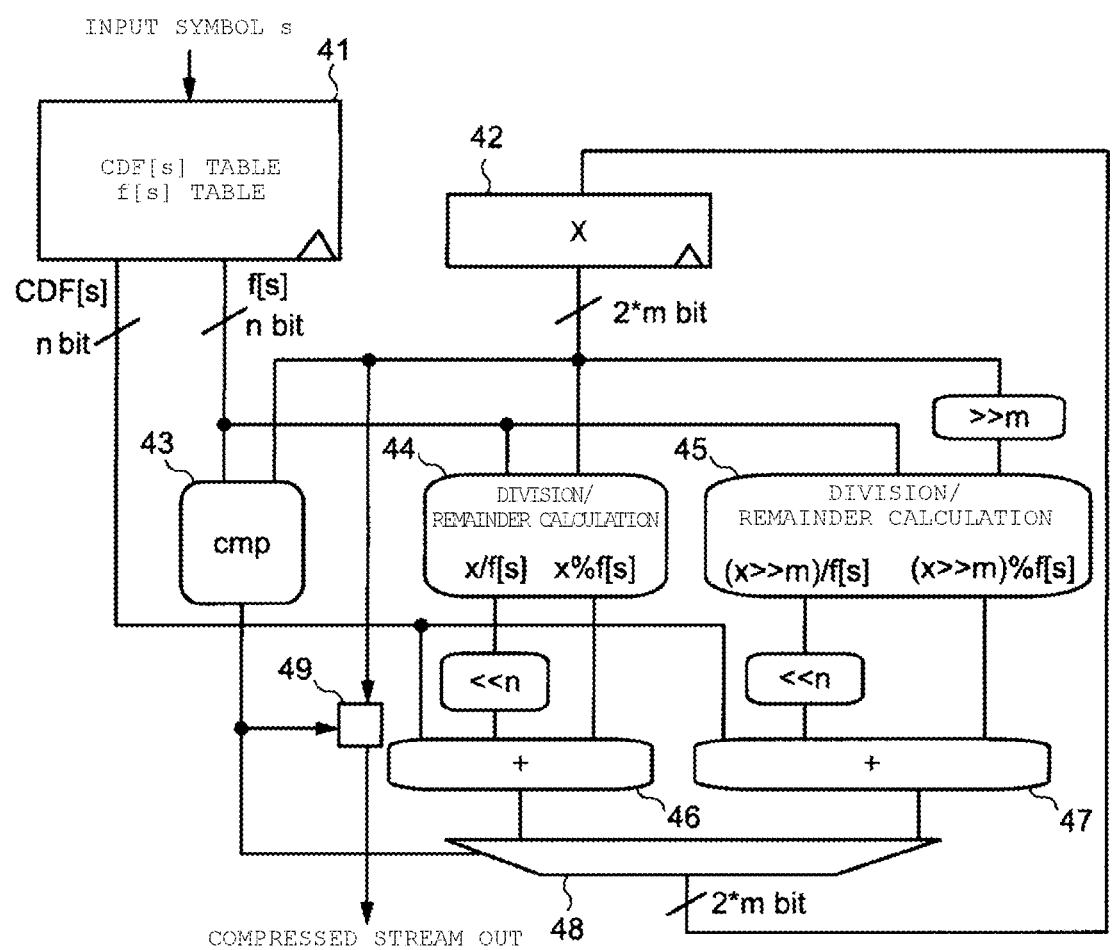
FIG. 2 is a circuit diagram of an entropy encoding device according to the first embodiment.

FIG. 2 illustrates a circuit diagram when the pseudocode described above is implemented by hardware. In this circuit, comparison of an overflow determination of the internal state x and division/remainder calculation are performed simultaneously. Furthermore, the division/remainder calculation are performed speculatively in parallel when the internal state x overflows and when the internal state x does not overflow. As a result, it is possible to increase an operating frequency.

As illustrated in FIG. 2, the entropy encoding device 40 includes a table 41, a register 42, a comparator 43, division/remainder calculation units 44 and 45, adders 46 and 47, a selector 48, and an output unit 49.

The table 41 includes a CDF[s] table and an f [s] table, each having the input symbol s as an entry. An output of CDF[s] has n bits and an output of f[s] has n bits.

The register 42 stores the internal state x. The register 42 has a length of 2*m bits.

The comparator 43 (cmp) compares f[s]<<(2*m-n) (a value obtained by bit-shifting of f[s] to the left by (2*m-n) bits) with the internal state x. Specifically, the comparator 43 compares f[s] with upper (2*m-n) bits of the internal state x. As a result, comparison of a (2*m-n) bit is performed by the comparator 43. This means that, when the internal state x is greater than or equal to f[s]<<(2*m-n), the internal state x overflows when the symbol s is calculated.

The entropy encoding device 40 includes two division/remainder calculation units 44 and 45. The division/remainder calculation unit 44 performs integer calculations of x/f[s] and x % f[s] respectively. A circuit (>>m) for shifting m bits to the right is provided between the register 42 and the division/remainder calculation unit 45. This means that a connection is made such that data of the internal state x greater than or equal to the m-th bit is input to the division/remainder calculation unit 45. The division/remainder calculation unit 45 performs integer calculations of (x>>m)/f[s] and (x>>m) % f[s] respectively. As described above, x>>m means shifting x to the right by m bits.

The division/remainder calculation unit 44 is connected to the register 42. Arithmetic processing performed by the division/remainder calculation unit 44 for the internal state x may be referred to as "first arithmetic processing". The division/remainder calculation unit 44 performs the first arithmetic processing for the internal state x, and an output may be referred to as "first output".

The division/remainder calculation unit 45 is connected to the register 42. Arithmetic processing performed by the division/remainder calculation unit 45 for the internal state x may be referred to as "second arithmetic processing". As described above, the division/remainder calculation unit 45 performs the second arithmetic processing for the internal state x shifted by a predetermined number of bits. The division/remainder calculation unit 45 performs the second arithmetic processing for the internal state x, and an output may be referred to as a "second output".

The division/remainder calculation unit 44 and the division/remainder calculation unit 45 are connected to each other in parallel between the register 42 and the selector 48.

The adder 46 adds x/f[s]<<n, x % f[s], and CDF[s]. A circuit (<<n) for performing a shift to the left by n bits is provided between an output of x/f[s] of the division/remainder calculation unit 44 and the adder 46. This means that data obtained by shifting x/f[s] by n bits is input to the adder 46. The adder 47 adds ((x>>m)/f[s])<<n, (x>>m) % f[s], and CDF[s]. A circuit (<<n) for performing a shift by n bits is provided between an output of (x>>m)/f[s] of the division/remainder calculation unit 45 and the adder 47. This means that data obtained by shifting (x>>m)/f[s] by n bits is input to the adder 47.

The selector 48 is connected to the adders 46 and 47, and receives a value calculated by the adder 46 based on the first output from the division/remainder calculation unit 44 and a value calculated by the adder 47 based on the second output from the division/remainder calculation unit 45. The selector 48 determines whether the internal state x overflows according to an output of the comparator 43. When the selector 48 determines that the internal state x does not overflow, the selector 48 selects an output of adder 46. Meanwhile, when the selector 48 determines that the internal state x overflows, the selector 48 selects an output of the adder 47. The selector 48 supplies the selected output to the register 42 as the new internal state x. That is, the selector 48 selects one of a value calculated based on the first output and a value calculated based on the second output, based on a magnitude of the value of the internal state x, and outputs the selected value to the register 42.

The output unit 49 outputs lower m bits of the internal state x to the compressed stream OUT according to the output of the comparator 43 when the internal state x overflows. The data output to the compressed stream OUT is randomized by the randomizer 14, an error of the data is corrected and encoded by the ECC circuit 15, and the data is written to the non-volatile memory 20 through the memory interface 18, as described above.

1-3. Configuration of Decoding Device 50

The decoding device 50 according to the first embodiment of the present disclosure will be described with reference to FIG. 3. The decoding device 50 decodes a compressed stream entropy-encoded by the entropy encoding device 40. The decoding device 50 is also provided in the compression/extension circuit 16. The decoding device 50 is a device in which an rANS method, that is one of arithmetic encoding methods, is implemented by hardware.

Figure 3:
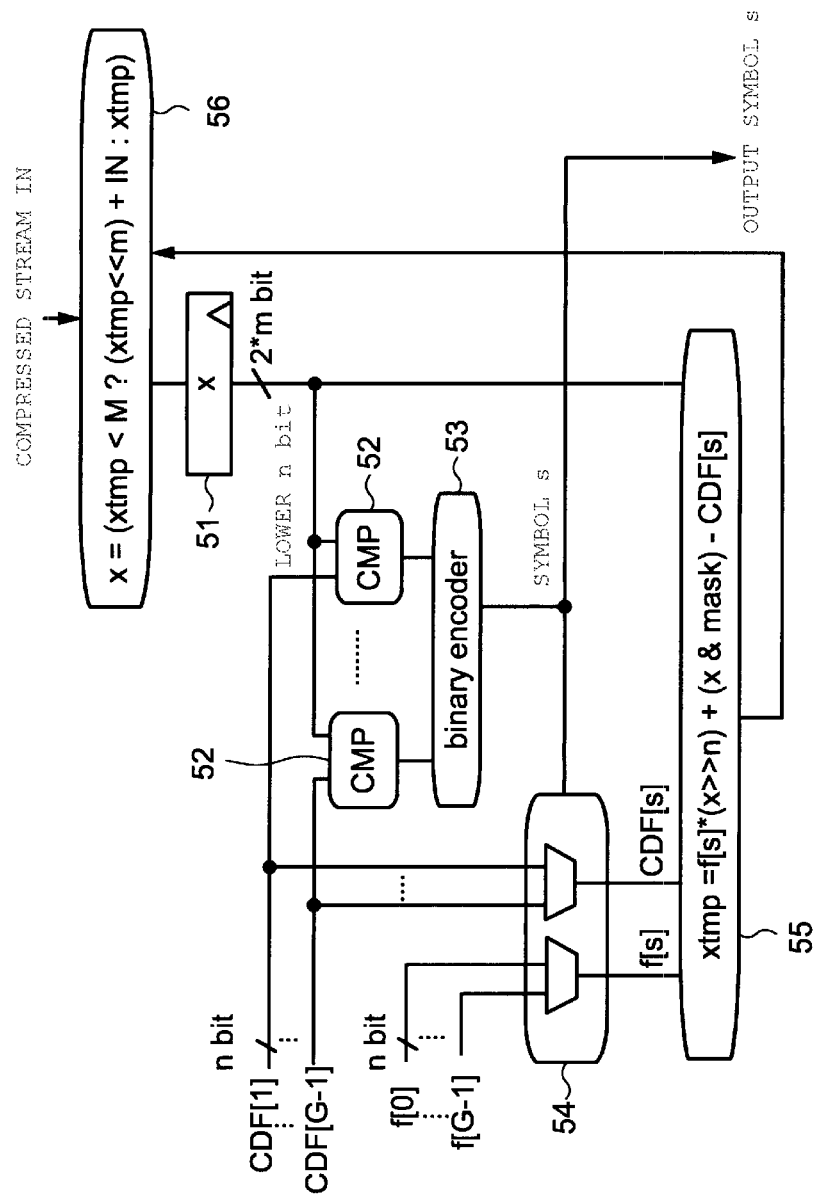
FIG. 3 is a circuit diagram of a decoding device according to the first embodiment.

FIG. 3 is a circuit diagram of the decoding device 50. The decoding device 50 generates an output symbol s from an input compressed stream IN. The decoding device 50 is implemented by hardware so as to repeatedly perform the following calculation D(x). The compressed stream IN is, for example, data that the compression/extension circuit 16 is instructed to extend from the processor 11. The generated output symbol s is stored in the RAM 12 by, for example, the processor 11.

$$s = symbol(x \ \& \ mask)$$

$$D(x) = (f[s]*(x>>n) + (x \ \& \ mask) \cdot CDF[s], s)$$

Here, mask is $2^n-1$ and is a value having n bits of 1 arranged in a lower part. x&mask means a taking-out operation of lower n bits from the internal state x. − is subtraction. symbol(y) is a function that outputs a symbol corresponding to y and means processing of searching for the output symbol s that satisfies the following conditions.

$$symbol(y) = s \ such \ that \ CDF[s] <= y < CDF[s+1]$$

As described above, CDF[s] is monotonically incremental. symbol(y) corresponds to an inverse function of CDF[s].

The internal state x has a length of 2*m bits. A value of the internal state x is reduced each time a decoding unit performs repetition processing. When the value of the internal state x is only the lower m bits, the value of the internal state x is shifted to the left by m bits, and data of m bits are taken from the compressed stream IN into blank lower m bits.

A pseudocode used when a circuit for performing the calculation defined by the above equation is mounted is as follows.

```
M = 1<<m
x = input_stream(2*m);//Input 2*m bits from the stream and
set thereof to the initial state.
    do {
    s = symbol(x & mask)
    x = f[s] * (x>>n) + (x & mask) - CDF[s];//Update the
state
    if (x < M){//Does the state underflow?
        x = (x<<m) + input_stream(m);//Insert m bits of
the next data from the stream into the state.
    }
    output_symbol(s);//Output the symbol.
} while (s != EOF)
```

M is defined as 1<<m. M is, for example, a value of 00 . . . 010 . . . 00 and is a value in which 1 exists from the least significant bit (LSB) to the m+1-th bit. mask is $2^n-1$. mask is, for example, a value of 00 . . . 001 . . . 11 and is a value in which 1 exists in all m bits from the LSB.

input_stream(m) is a function representation for performing processing of inputting m bits from the input compressed stream IN. x=input_stream(2*m) is processing of extracting 2*m bits from the input compressed stream IN and setting the 2*m bits to the internal state x. do{ }while (s!=EOF) means repetition of processing until the output symbol s reaches an end of data.

The processing to be repeated includes first processing, second processing, and third processing as described below.

In the first processing, a symbol function is used to first acquire the symbol s corresponding to the lower m bits (x&mask) of the internal state x.

In the second processing, a value, which is obtained by adding the lower m bits of the internal state x to a value obtained by multiplying f[s] by x>>n obtained by shifting the internal state x to the right by n bits and subtracting CDF[s] therefrom, is updated as a new internal state x.

In the third processing, it is determined whether x is (underflows) within the m bits, and when x underflows, the internal state x is shifted to the left by m bits, and m bits taken from the compressed stream IN are inserted into the blank lower m bits of the internal state x. Then, the symbol s is finally output.

FIG. 3 is a circuit diagram of the decoding device 50 in which the pseudocode described above is implemented by hardware.

As illustrated in FIG. 3, the decoding device 50 includes a register 51, comparators 52, a binary encoder 53, a selector 54 and an arithmetic circuit 55.

A length of register 51 is 2*m bits. The register 51 stores an internal state x. Each time processing of the decoding device 50 is repeated, a value of internal state x is reduced. When the internal state x is reduced to be less than m bits, m bits of the compressed stream IN input from the outside are combined with the internal state x.

The decoding device 50 includes G−1 comparators 52 and the binary encoder 53. Each of the comparators 52 compares CDF[1] to CDF[G−1] with lower n bits of the internal state x (G is a natural number of 2 or more). G indicates the number of symbol types. For example, G is 256 for an 8-bit ASCII (registered trademark) character string. Outputs of the comparators 52 are input to the binary encoder 53, and the binary encoder 53 outputs the symbol s. This circuit corresponds to implementation of a symbol function.

The selector 54 outputs each of f[s] and CDF[s]according to the symbol s.

The arithmetic circuit 55 calculates a tentative internal state xtmp by adding lower m bits (x&mask) of x to a value obtained by multiplying f[s] by (x>>n) and subtracting CDF[s] therefrom, and outputs the tentative internal state xtmp. x>>n means a value obtained by shifting the internal state x to the right by n bits.

A comparison operation circuit 56 perform comparison of the tentative internal state xtmp with M. The comparison operation circuit 56 determines whether the tentative internal state xtmp is less than or equal to m bits based on the comparison. When the tentative internal state xtmp is less than or equal to m bits, the comparison operation circuit 56 shifts the tentative internal state xtmp to the left by m bits, inserts data of m-bit taken from the compressed stream IN into a blank region of m bits, and thereby, the internal state x is updated. When the tentative internal state xtmp is not less than or equal to m bits, the tentative internal state xtmp is used as it is as the internal state x. Then, the internal state x obtained by doing so is stored in the register 51.

2. Second Embodiment

A memory system according to a second embodiment will be described. In a memory system 1 according to the second embodiment, a configuration of an entropy encoding device 60 in the compression/extension circuit 16 differs from the configuration of the entropy encoding device 40 of the memory system 1 according to the first embodiment. Other configurations are the same as in the first embodiment, and thus, descriptions thereof are omitted.

2-1. Configuration of Entropy Encoding Device 60

The entropy encoding device 60 according to the second embodiment of the present disclosure will be described below. The entropy encoding device 40 includes a division circuit and a remainder calculation circuit. Since circuit sizes of the division circuit and the remainder calculation circuit are large and there is a delay due to the circuits, improvement of an operating frequency of the entropy encoding device may be limited. An operating frequency of the entropy encoding device 60 can be further increased by replacing configurations of the division circuit and the remainder calculation circuit with other configurations.

The entropy encoding device 60 includes a multiplication circuit instead of the division circuit. Then, the entropy encoding device 60 further includes a circuit for correcting an error occurring when division is replaced with multiplication.

Figure 4:
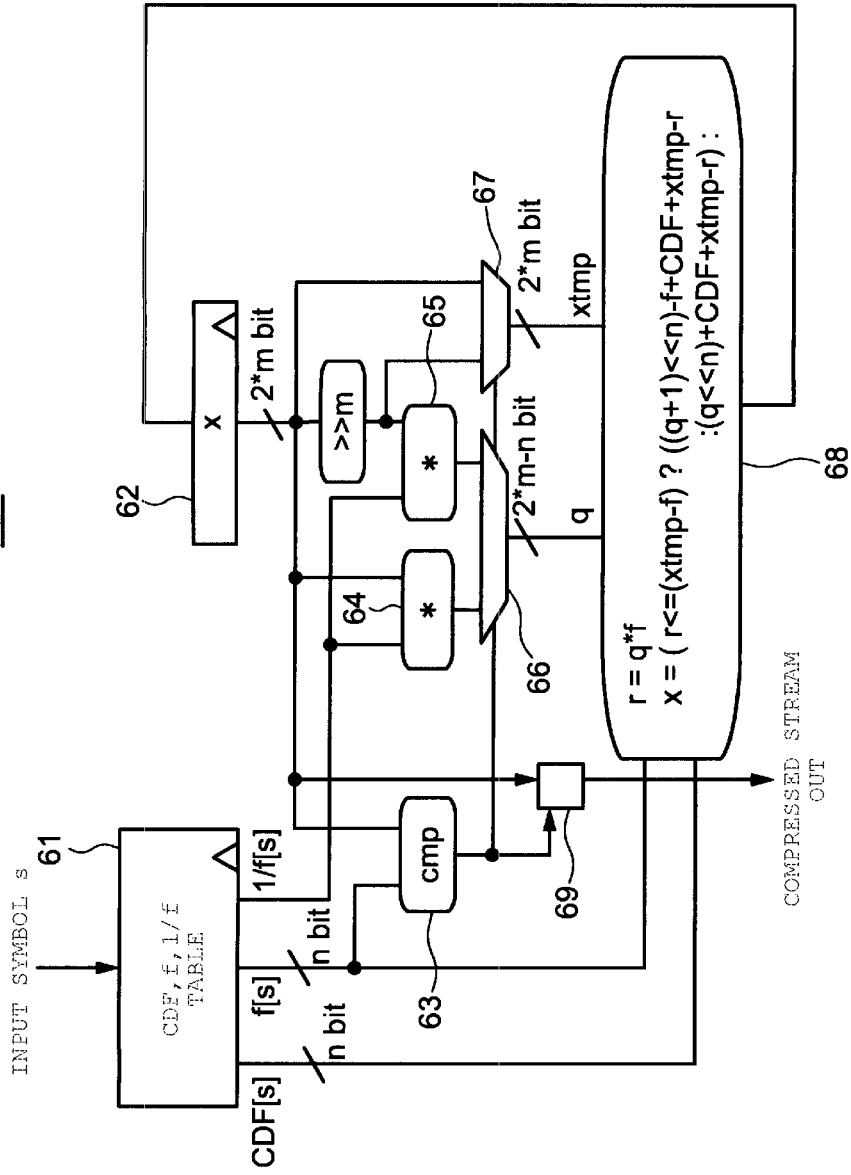
FIG. 4 is a circuit diagram of an entropy encoding device according to a second embodiment.

FIG. 4 is a circuit diagram of the entropy encoding device 60. The entropy encoding device 60 is provided in the compression/extension circuit 16. The entropy encoding device 60 is a device in which an rANS method, that is one of arithmetic encoding methods, is implemented by hardware. The entropy encoding device 60 performs encode processing (compression). The entropy encoding device 60 generates a compressed stream OUT from an input symbol s.

x is an internal state value. s is an input symbol to be encoded. f[s] is a value obtained by multiplying an appearance probability of the symbol s by $2^n$ and has a length of n bits. The appearance probability of the symbol s is represented as $f[s]/2^n$. * is multiplication. CDF[s] is a cumulative distribution function of f[s] and is monotonically incremental. Values of f[s] and CDF[s] for the input symbol s are calculated in advance and respectively stored in tables.

The entropy encoding device 60 also calculates in advance 1/f[s] and stores the calculated value in a table. 1/f[s] is data in a floating point format. Significant digits of 1/f [s] are more than or equal to (2*m-n+1) bits.

The circuit diagram of the entropy encoding device 60 illustrated in FIG. 4 is obtained by replacing x/f[s] of the entropy encoding device 40 illustrated in FIG. 2 with x*(1/f[s]) and implemented by hardware. Also, in this circuit, comparison and multiplication of overflow determination of the internal state x are performed simultaneously. Furthermore, multiplications are performed speculatively in parallel when the internal state x overflows and when the internal state x does not overflow. It is noted that, in the present embodiment, the speculative calculation (multiplication) is not essential.

As illustrated in FIG. 4, the entropy encoding device 60 includes a table 61, a register 62, a comparator 63, multiplication units 64 and 65, selectors 66 and 67, a comparison operation circuit 68, and an output unit 69.

The table 61 includes a CDF[s] table, an f[s] table, and a 1/f[s] table, each having an input symbol s as an entry. An output of CDF[s] has n bits and an output of f[s] has n bits. 1/f[s] is in a floating point format. Significant digits of a mantissa part are more than or equal to (2*m-n+1) bits.

f[s] for the input symbol s may be referred to as "a value corresponding to an appearance frequency of the input symbol", for example, f [s] may be referred to as a "first value". 1/f[s] may be referred to as a "reciprocal of a first value". CDF[s] for the input symbol s may be referred to as a "cumulative distribution value". Using the above expression, it can be said that the table 61 stores, for each symbol, a first value corresponding to an appearance frequency of the input symbol and a reciprocal of the first value.

The register 62 stores the internal state x. The register 62 has a length of 2*m bits.

The comparator 63 (cmp) compares f[s]<<(2*m-n) (a value obtained by bit-shifting of f[s] to the left by (2*m-n) bits) with the internal state x. Specifically, the comparator 63 compares f[s] with upper (2*m-n) bits of the internal state x. As a result, comparison of a (2*m-n) bit is performed by the comparator 63. This means that, when the internal state x is greater than or equal to f[s]<<(2*m-n), the internal state x overflows when the symbol s is calculated.

The entropy encoding device 60 includes two multiplication units 64 and 65. The multiplication unit 64 calculates x*(1/f [s]). A circuit (>>m) for performing a shift to the right by m bits is provided between the register 62 and the multiplication unit 65. This means that data of the m-th bit or more of the internal state x is input to the multiplication unit 65. The multiplication unit 65 calculates (x>>m)*(1/f [s]).

The arithmetic processing performed by the multiplication unit 64 for the internal state x may be referred to as "first arithmetic processing". Performing the first arithmetic processing for the internal state x by using the multiplication unit 64 and outputting the result may be referred to as a "first output."

The arithmetic processing performed by the multiplication unit 65 for the internal state x may be referred to as "second arithmetic processing". Performing the second arithmetic processing for the internal state x by using the multiplication unit 65 and outputting the result may be referred to as a "second output".

The multiplication unit 64 and the multiplication unit 65 are connected to each other in parallel between the register 62 and the selector 66.

The entropy encoding device 60 includes two selectors 66 and 67. The selector 66 determines whether the internal state x overflows according to an output of the comparator 63. When the selector 66 determines that the internal state x does not overflow, the selector 66 selects an output of the multiplication unit 64 and outputs the output (fourth value) from the multiplication unit 64 as a quotient q. Meanwhile, when the selector 66 determines that the internal state x overflows, the selector 66 selects an output of the multiplication unit 65 and outputs the output from the multiplication unit 65 as the quotient q. In order for an error correction, which will be described below, to be made correctly, significant digits of the quotient q need to be (2*m-n) bits or more. In other words, the selector 66 selects any one of a value calculated based on the first output and a value calculated based on the second output, based on a magnitude of a value of the internal state x, and outputs the selected value to the comparison operation circuit 68.

Here, a length of the data of q is (2*m-n) bits. The selector 67 determines whether the internal state x overflows according to an output of the comparator 63. When the selector 67 determines that the internal state x does not overflow, the selector 67 selects x as a tentative internal state xtmp. Meanwhile, when the selector 67 determines that the internal state x overflows, the selector 67 selects x>>m as the tentative internal state xtmp. A length of data of the tentative internal state xtmp is 2*m bits.

The entropy encoding device 60 further includes the comparison operation circuit 68. The comparison operation circuit 68 first calculates r by calculating q*f[s]. That is, the comparison operation circuit 68 multiplies f[s] (first value) output from the table 61 by the quotients q output from the multiplication units 64 and 65. It is determined whether r is less than or equal to (xtmp-f[s]). A case where r is less than or equal to (xtmp-f[s]) means that a difference of −1 occurs in the quotient q as a result of contrasting division by f[s] and multiplication by 1/f[s]. Therefore, 1 needs to be added to q in order to obtain a correct arithmetic result. In other words, the comparison operation circuit 68 determines whether the value r obtained by multiplying f[s] (first value) by the quotient q satisfies a predetermined criterion (whether the value is less than or equal to xtmp-f[s]), and when it is determined that the criterion is not satisfied, correction (adding 1 to q) is performed.

When r is less than or equal to xtmp-f[s] (when there is an error of −1), the comparison operation circuit 68 subtracts f[s] from a value obtained by shifting q+1 to the left by n bits, adds CDF[s] thereto, adds xtmp thereto, subtracts r therefrom, and thereby, the internal state x is calculated. Meanwhile, when r is not less than or equal to xtmp-f[s] (when the error is zero), CDF[s] is added to a value obtained by shifting q to the left by n bits, add xtmp thereto, subtracts r therefrom, and thereby, the internal state x is calculated. The internal state x calculated by doing so is stored in the register 62. That is, the internal state x is updated based on the result of multiplication of f[s] (first value) by quotient q.

The output unit 69 outputs lower m bits of the internal state x to the compressed stream according to an output of the comparator 63 when the internal state x overflows.

As described above, according to the entropy encoding device 60 of the present embodiment, rANS may be implemented by hardware without using a division circuit and a remainder calculation circuit. As a result, an operating frequency of the entropy encoding device 60 can be improved.

3. Third Embodiment

A memory system according to a third embodiment will be described. In a memory system 1 according to the third embodiment, a configuration of an entropy encoding device 70 in the compression/extension circuit 16 differs from the configuration of the entropy encoding device 40 of the memory system 1 according to the first embodiment. Other configurations are the same as in the first embodiment, and thus, descriptions thereof are omitted.

3-1. Configuration of Entropy Encoding Device 70

The entropy encoding device 70 according to the third embodiment of the present disclosure will be described below. The entropy encoding device 60 provides tables respectively related to f[s] and 1/f[s] for all entries of the input symbol s. Meanwhile, the entropy encoding device 70 does not include the tables, and thus, a circuit size can be reduced while maintaining a high operating frequency like the entropy encoding device 60.

The entropy encoding device 70 includes a difference calculation circuit 715 that calculates f[s] and a reciprocal calculator 718 that calculates 1/f[s] instead of omitting a table corresponding to the table 61 of FIG. 4. The entropy encoding device 70 includes a circuit for correcting an error occurring when division is replaced with multiplication, like the entropy encoding device 60. In other words, it can be said that the reciprocal calculator 718 generates 1/f[s], which is a reciprocal of f[s] (first value) based on f[s] corresponding to an appearance frequency of the input symbol.

Figure 5:
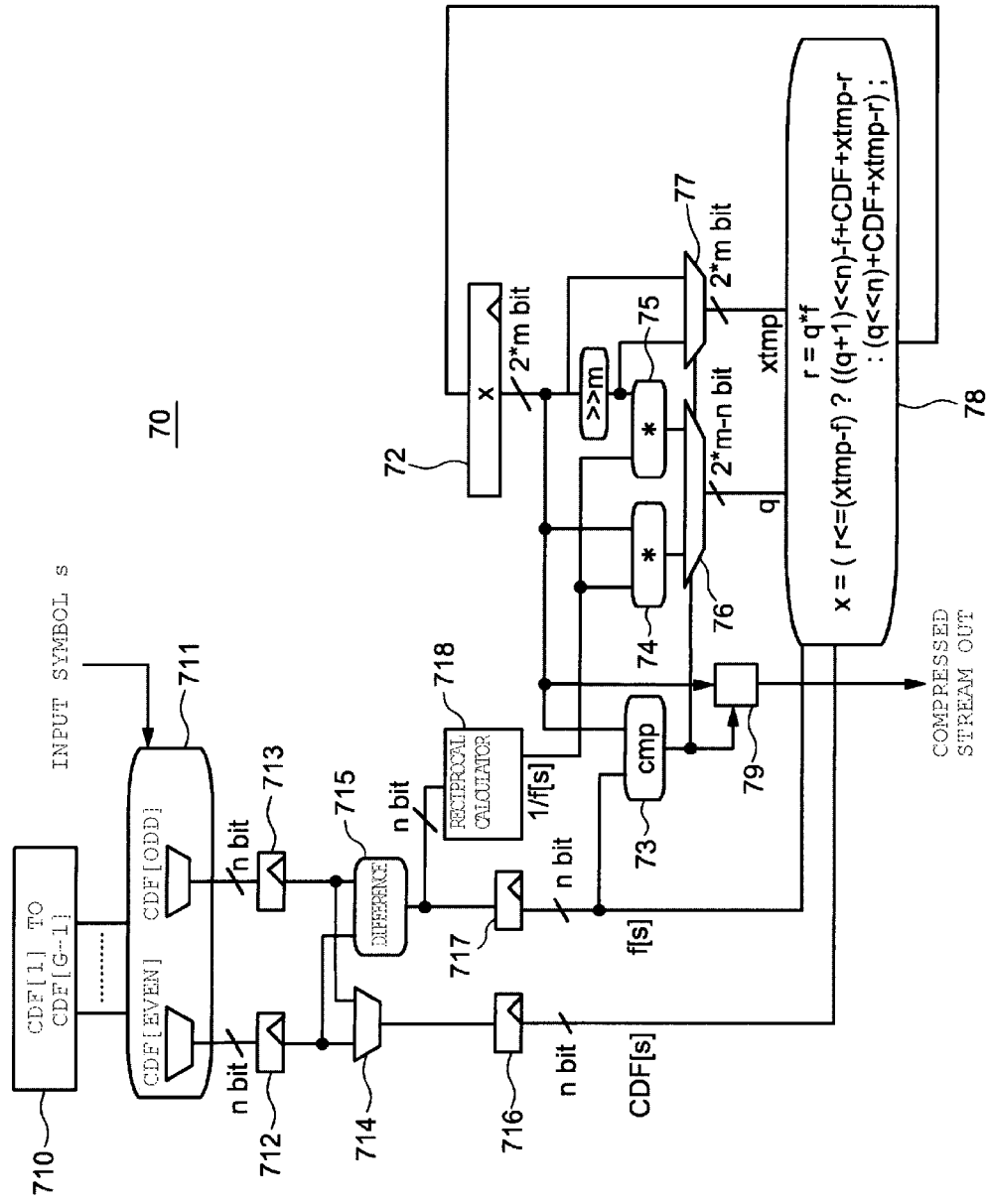
FIG. 5 is a circuit diagram of an entropy encoding device according to a third embodiment.

FIG. 5 is a circuit diagram of the entropy encoding device 70. The entropy encoding device 70 is provided in the compression/extension circuit 16. The entropy encoding device 70 is a device in which an rANS method, that is one of arithmetic encoding methods, is implemented by hardware. The entropy encoding device 70 performs encode processing (compression). The entropy encoding device 70 generates a compressed stream OUT from an input symbol s.

x is an internal state value. s is an input symbol to be encoded. f[s] is a value obtained by multiplying an appearance probability of the symbol s by $2^n$ and has a length of n bits. The appearance probability of the symbol s is represented as $f[s]/2^n$. * is multiplication. CDF[s] is a cumulative distribution function of f[s] and is monotonically incremental. Values of CDF[s] for the input symbol s are calculated in advance and stored in a CDF[s] table 710.

As illustrated in FIG. 5, the entropy encoding device 70 includes a table 710, a selector circuit 711, registers 712, 713, 716, and 717, a selector 714, a difference calculation circuit 715, and a reciprocal calculator 718. These are disposed outside a loop for updating the internal state x. The entropy encoding device 70 includes a register 72, a comparator 73, multiplication units 74 and 75, selectors 76 and 77, a comparison operation circuit 78, and an output unit 79 in addition to the above configuration. A register 72, a comparator 73, multiplication units 74 and 75, selectors 76 and 77 and a comparison operation circuit 78 are disposed in a loop for updating the internal state x. An output unit 79 is disposed outside a loop for updating the internal state x.

Configurations and functions of the register 72, the comparator 73, the multiplication units 74 and 75, the selectors 76 and 77, the comparison operation circuit 78, and the output unit 79 are the same as the configurations and the functions of the register 62, the comparator 63, the multiplication unit 64 and 65, the selectors 66 and 67, the comparison operation circuit 68, and the output unit 69 which are illustrated in FIG. 4, and accordingly, descriptions thereof are omitted.

The selector circuit 711 selects a pair of adjacent CDF [even] and CDF[odd] according to the input symbol s. For example, when the input symbol s is the k-th symbol, CDF[k−1] and CDF[k] are selected (k is a natural number of 2 or more). More specifically, when the input symbol s is the eighth symbol, CDF[7] and CDF[8] are selected, and when the input symbol s is the ninth symbol, CDF[8] and CDF[9] are selected.

The selected CDF[even] is stored in the register 712 and the selected CDF[odd] is stored in the register 713. Each of the registers 712 and 713 has a length of n bits. The selector 714 selects one of the registers 712 and 713 according to whether the input symbol s is an odd number or an even number and outputs the selection result to the register 716. As a result, the register 716 stores CDF[s]. The register 716 also has a length of n bits. Accordingly, by dividing a CDF[s] table into two entries of an even entry(k) and an odd entry(k−1), the input number of selectors can be reduced by half.

The difference calculation circuit 715 calculates a difference between CDF[even] stored in the register 712 and CDF[odd] stored in the register 713. Since CDF[s+1]−CDF [s]=f[s] from a calculus of CDF[s] shown in Equation (1), the difference calculation circuit 715 can calculate f[s] from the above difference. f[s] calculated in this way is stored in the register 717. A length of the register 717 is also n bits. Accordingly, by calculating f[s] from a pair of CDF[even] and CDF[odd], an f[s] table can be omitted.

The reciprocal calculator 718 calculates a reciprocal 1/f[s] of f[s] output from the difference calculation circuit 715 and outputs the calculated reciprocal number. 1/f[s] is data in a floating point format, and it is preferable that the significant digits of a mantissa part are (2*m-n+1) bits. Provision of the reciprocal calculator 718 allows a 1/f[s] table to be omitted. Furthermore, the reciprocal calculator 718 can be disposed outside a loop for updating the internal state x. Therefore, it is possible to configure the reciprocal calculator 718 as an independent pipeline. There are several options for implementing the reciprocal calculator 718. For example, when m=12 and n=11, the number of significant digits required for a reciprocal calculator is about 14 bits. In this case, a combination of polygonal line approximation and a correction table can be implemented with a smaller circuit footprint.

As described above, according to the entropy encoding device 70 of the present embodiment, a table related to f[s] and 1/f[s] can be omitted in the entropy encoding device 60, and thus, a circuit size can be reduced while maintaining a high operating frequency like the entropy encoding device 60.

4. Fourth Embodiment

A memory system according to a fourth embodiment will be described. In a memory system 1 according to the fourth embodiment, a configuration of a decoding device 80 in the compression/extension circuit 16 differs from the configuration of the decoding device 50 of the memory system 1 according to the first embodiment. Other configurations are the same as in the first embodiment, and thus, descriptions thereof are omitted.

4-1. Configuration of Decoding Device 80

Hereinafter, the decoding device 80 for decoding an entropy-encoded compressed stream according to the fourth embodiment of the present disclosure will be described. The decoding device 80 is provided in the compression/extension circuit 16. The decoding device 80 is a device in which an rANS method, that is one of arithmetic encoding methods, is implemented in hardware.

Figure 6:
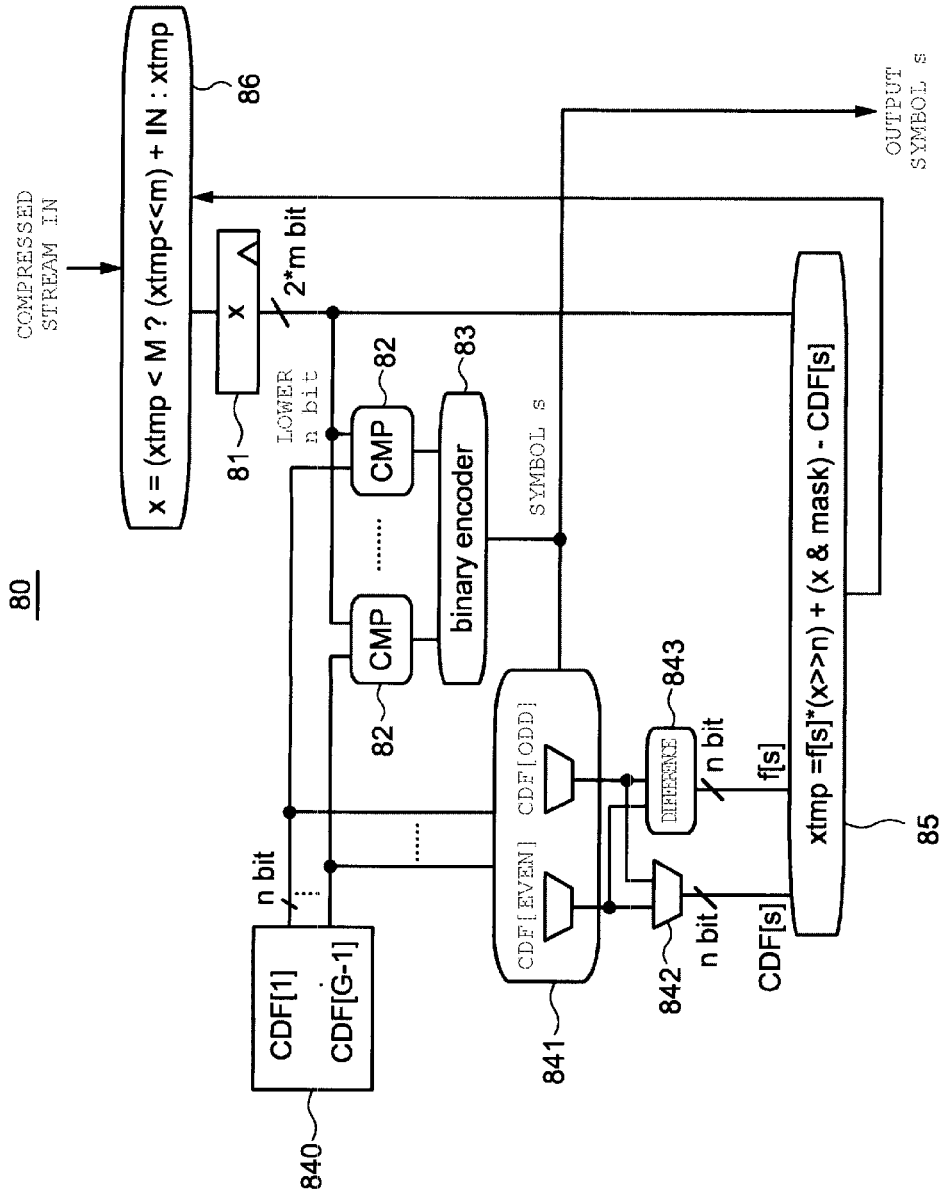
FIG. 6 is a circuit diagram of a decoding device according to a fourth embodiment.

FIG. 6 is a circuit diagram of the decoding device 80. The decoding device 80 generates an output symbol s from an input compressed stream IN. As illustrated in FIG. 6, the decoding device 80 includes a register 81, comparators 82, a binary encoder 83, a table 840, a selector circuit 841, a selector 842, a difference calculation circuit 843, an arithmetic circuit 85, and a comparison operation circuit 86. The table 840 stores CDF[s] for the symbol s. The table 840 stores data CDF[1] to CDF[G-1] for the total number of symbols G.

Configurations and functions of the register 81, the comparators 82, the binary encoder 83, the arithmetic circuit 85, and the comparison operation circuit 86 are the same as the configurations and functions of the register 51, the comparators 52, the binary encoder 53, the arithmetic circuit 55, and the comparison operation circuit 56 illustrated in FIG. 3, and thus, descriptions thereof are omitted.

The selector circuit 841 selects a pair of adjacent CDF[even] and CDF[odd] according to the symbol s input to the selector circuit 841. For example, when the symbol s is the k-th symbol, CDF[k] and CDF[k-1] are selected (k is a natural number of 2 or more). Then, the selected CDF[even] and the selected CDF[odd] are selected by the selector 842. The selector 842 selects any one of the selected CDF[even] and the selected CDF[odd] according to whether the symbol s is an odd number or an even number, and outputs the selected CDF[s]. Accordingly, by dividing a CDF[s] table into two entries of an even entry(k) and an odd entry(k-1), the input number of selectors can be reduced by half.

The difference calculation circuit 843 calculates a difference between CDF[even] and CDF[odd] and outputs f[s] which is the calculation result. The arithmetic circuit 85 updates the internal state x based on f[s] calculated by doing so. Accordingly, by calculating f[s] from a pair of CDF [even] and CDF[odd], an f[s] table and a selector for selecting the f[s] table can be omitted.

As described above, according to the decoding device 80 of the present embodiment, a table and a selector related to f[s] can be omitted in the decoding device 50, and thus, a circuit size can be reduced.

5. Fifth Embodiment

A memory system according to a fifth embodiment will be described. In a memory system 1 according to the fifth embodiment, a configuration of a decoding device 90 in the compression/extension circuit 16 differs from the configuration of the decoding device 80 of the memory system 1 according to the fourth embodiment. Other configurations are the same as in the fourth embodiment, and thus, descriptions thereof are omitted.

5-1. Configuration of Decoding Device 90

Hereinafter, the decoding device 90 for decoding an entropy-encoded compressed stream according to the fifth embodiment of the present disclosure will be described. The decoding device 90 is also provided in the compression/extension circuit 16. The decoding device 90 is a device in which an rANS method, that is one of arithmetic encoding methods, is implemented in hardware.

Figure 7:
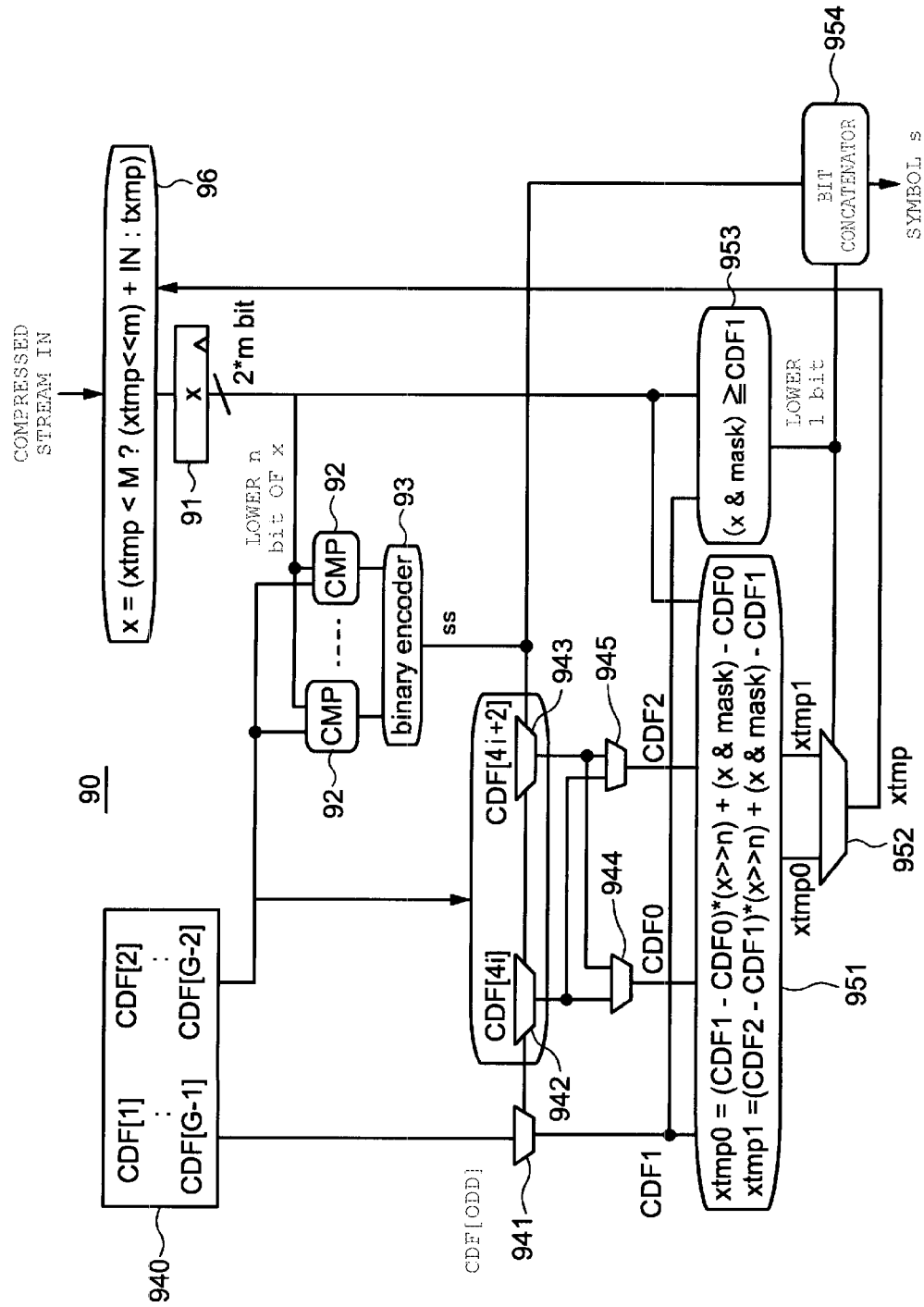
FIG. 7 is a circuit diagram of a decoding device according to a fifth embodiment.

FIG. 7 is a circuit diagram of the decoding device 90. The decoding device 90 generates an output symbol s from an input compressed stream IN. Based on the decoding device 80, the decoding device 90 speculatively performs a calculation to obtain a next internal state when a value of the symbol s is an even number and when a value of the symbol s is an odd number. As a result, the number of parallel comparisons can be reduced. This corresponds to a combination of binary search and parallel comparison.

As illustrated in FIG. 7, the decoding device 90 includes a register 91, comparators 92, a binary encoder 93, a table 940, selectors 941, 942, 943, 944, and 945, an arithmetic circuit 951, a selector 952, a comparison operation circuit 953, a bit concatenator 954, and a comparison operation circuit 96. The table 940 stores CDF[s] for the symbol s. The table 940 stores data CDF[1] to CDF[G-1] for the total number of symbols G. The comparator 92 may be referred to as a "first comparator".

A length of register 91 is 2*m bits. The register 91 stores an internal state x. Each time processing of the decoding device 90 is repeated, a value of internal state x is reduced. When the internal state x is reduced to be less than m bits, the internal state x is combined with m bits of the compressed stream IN input from the outside.

The decoding device 90 includes G/2-1 comparators 92 and the binary encoder 93. Each of the comparators 92 compares CDF[2] to CDF[G-2] for even symbol s with lower n bits of the internal state x. Outputs of the comparators 92 are input to the binary encoder 93, and the binary encoder 93 outputs a value ss obtained by removing the lower 1 bit of the symbol s. This circuit corresponds to implementation of the part of a symbol function from which the lower 1 bit is removed.

The selector 941 selects CDF[odd] for the symbol s of an odd number, and the selectors 942 and 943 select CDF[4i] and CDF[4i+2] (where i is an integer) according to the value ss obtained by removing the lower 1 bit (for example, the least significant bit) of the input symbol s. CDF[odd] means that an entry number of CDF input to the selector 941 is an odd number. CDF[4i] means that an entry number of CDF input to the selector 942 is 4i (a multiple of 4). CDF[4i+2] means that an entry number of CDF input to the selector 943 is 4i+2 (a number obtained by adding 2 to a multiple of 4). As for a specific relationship between the symbol s and the value ss, the value ss is 0 when the symbol s is 0 or 1, and the value ss is 2 when the symbol s is 2 or 3 as illustrated in FIG. 8.

An entry number of CDF[odd] is ss+1. An entry number of each of CDF[4i] and CDF[4i+2] is a value close to ss+1. Specifically, as illustrated in FIG. 8, when the symbol s is 0 or 1 and the value ss is 0, the entry number of CDF[odd] is 1 (CDF[1]), and the entry number of CDF[4i] is 0 (CDF[0]), and the entry number of CDF[4i+2] is 2 (CDF[2]). When the symbol s is 2 or 3 and the value ss is 2, the entry number of CDF[odd] is 3 (CDF[3]), the entry number of CDF[4i] is 4 (CDF[4]), and the entry number of CDF[4i+2] is 2 (CDF[2]). When the symbol s is 4 or 5 and the value ss is 4, the entry number of CDF[Odd] is 5 (CDF[5]), the entry number of CDF[4i] is 4 (CDF[4]), and the entry number of CDF[4i+2] is 6 (CDF[6]). When the symbol s is 6 or 7 and the value ss is 6, the entry number of CDF[odd] is 7 (CDF[7]), the entry number of CDF[4i] is 8 (CDF[8]), and the entry number of CDF[4i+2] is 6 (CDF[6]). As described above, in the present embodiment, three adjacent CDF[s] are selected. It is noted that the number of CDF[s] to be selected may be four or more.

The selector 944 selects a smaller one of CDF[4i] and CDF[4i+2] selected according to the value ss and outputs the selected value as CDF0. The selector 945 selects a larger one of CDF[4i] and CDF[4i+2] selected according to the value ss and outputs the selected value as CDF2. Specifically, as illustrated in FIG. 8, when the symbol s is 0 or 1 and the value ss is 0, CDF[0] is output as CDF0, CDF[1] is output as CDF1, and CDF[2] is output as CDF2. When the symbol s is 2 or 3 and the value ss is 2, CDF[2] is output as CDF0, CDF[3] is output as CDF1, and CDF[4] is output as CDF2. Accordingly, by dividing a CDF[s] table into two entries of an even entry and an odd entry, the input number of selectors can be reduced by half.

The arithmetic circuit 951 performs two calculations speculatively and simultaneously. One is a calculation for obtaining a tentative internal state xtmp0, and the other is a calculation for obtaining a tentative internal state xtmp1.

One arithmetic unit of the arithmetic circuit 951 adds lower n bits x&mask of x to a value obtained by multiplying a value of CDF1-CDF0 by a value obtained by shifting the internal state x to the right by n bits, and subtracts CDF0 therefrom, thereby calculating and outputting a tentative internal state xtmp0. Specifically, as illustrated in FIG. 8, when the symbol s is 0, f[0] is obtained by CDF[1]-CDF[0].

Another arithmetic unit of the arithmetic circuit 951 adds lower n bits x&mask of x to a value obtained by multiplying a value of CDF2-CDF1 by the value obtained by shifting the internal state x to the right by n bits, and subtracts CDF1 therefrom, thereby calculating and outputting a tentative internal state xtmp1. Specifically, as illustrated in FIG. 8, when the symbol s is 1, f[1] is obtained by CDF[2]-CDF[1].

The comparison operation circuit 953 compares the lower n bits x&mask of the internal state x with CDF1. The comparison operation circuit 953 outputs 1 as a lower 1 bit of the symbol s when the lower n bits x&mask of the internal state x is greater than or equal to CDF1, and otherwise outputs 0 as the lower 1 bit of the symbol s. The comparison operation circuit 953 may be referred to as a "second comparator". The comparison operation circuit 953 compares at least one CDF among CDF0 to CDF2 selected by the selectors 941 to 945 with the internal state x.

The bit concatenator 954 concatenates a value output by the comparison operation circuit 953 and the value ss obtained by removing the lower 1 bit of the symbol s output by the binary encoder 93, thereby outputting the symbol s. In other words, the bit concatenator 954 generates an output symbol based on a comparison result obtained by a plurality of comparators 92 (first comparators) and a comparison result obtained by the comparison operation circuit 953 (second comparator). The bit concatenator 954 may be referred to as a "symbol generator."

The selector 952 selects the tentative internal state xtmp0 when the lower 1 bit of the symbol s output by the comparison operation circuit 953 is 0, selects the tentative internal state xtmp1 when the lower 1 bit of the symbol s is 1, and the tentative internal states are supplied to the comparison operation circuit 96 as a tentative internal state xtmp.

The comparison operation circuit 96 compares whether the tentative internal state xtmp is smaller than M. The comparison operation circuit 96 determines whether the tentative internal state xtmp is less than or equal to m bits based on this comparison. When the tentative internal state xtmp is less than or equal to m bits, the comparison operation circuit 96 shifts the tentative internal state xtmp to the left by m bits, and inserts data of the m bits taken from the compressed stream IN into a blank region of m bits, thereby updating the internal state x. When the tentative internal state xtmp is not less than or equal to m bits, the tentative internal state xtmp is set as the internal state x. The internal state x obtained by doing so is stored in the register 91.

While certain embodiments have been described, these embodiments have been presented by way of example only, and are not intended to limit the scope of the disclosure. Indeed, the novel embodiments described herein may be embodied in a variety of other forms; furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

Other effects different from the effects obtained by the aspects of the respective embodiments described above can be obtained naturally by the present disclosure, or what can be easily predicted by those skilled in the art can be naturally brought about by the present disclosure.

What is claimed is:
1. An entropy code encoder comprising:
a register;
a first arithmetic circuit configured to output, based on an input symbol to be compressed, a first value corresponding to an appearance frequency of the input symbol and a second value corresponding to a cumulative distribution of the first value;
a second arithmetic circuit configured to output a third value corresponding to division of a value of bits stored in the register by the first value;
a third arithmetic circuit configured to output a fourth value obtained by adding the second value to a bit-shifted value of the third value to the register, to update a value of bits stored in the register to the fourth value; and
a fourth arithmetic circuit configured to compare a value of upper bits stored in the register and the first value and output a value of lower bits stored in the register as a compressed data stream in accordance with a comparison result.

2. The entropy code encoder according to claim 1, wherein the first arithmetic circuit includes a first table storing cumulative distribution values corresponding to various values of input symbols, and obtains the second value corresponding to the input symbol by referring to the first table.

3. The entropy code encoder according to claim 2, wherein the first arithmetic circuit further includes a second table storing appearance frequency values corresponding to various values of input symbols, and obtains the first value corresponding to the input symbol by referring to the second table.

4. The entropy code encoder according to claim 3, wherein
the first arithmetic circuit further includes a third table storing reciprocals of appearance frequency values corresponding to various values of input symbols, and is configured to output a reciprocal of the first value corresponding to the input symbol by referring to the third table, and
the second arithmetic circuit includes a multiplier circuit configured to multiply the reciprocal of the first value and the value of the bits stored in the register, to obtain the third value.

5. The entropy code encoder according to claim 2, wherein the first arithmetic circuit includes a subtractor circuit configured to calculate a difference of the second value and a second value corresponding to the input symbol plus or minus 1 and calculate the first value based on the difference.

6. The entropy code encoder according to claim 1, wherein the second arithmetic circuit includes a first divider circuit configured to divide the value of the bits stored in the register by the first value, to obtain the third value.

7. The entropy code encoder according to claim 6, wherein
the second arithmetic circuit further includes a second divider circuit configured to divide the value of the bits stored in the register that have been bit-shifted by the first value, and
the third arithmetic circuit is configured to output a value obtained through addition of the second value and the value of the bits stored in the register divided by the first value, as the fourth value when the value of the bits stored in the register is less than the first value, and output a value obtained through addition of the second value and the value of the bits stored in the register that have been bit-shifted divided by the first value, as the fourth value when the value of the bits stored in the register is greater than the first value.

8. The entropy code encoder according to claim 1, wherein
the second arithmetic circuit includes a reciprocal calculation circuit configured to calculate a reciprocal of the first value and a multiplier circuit configured to multiply the reciprocal of the first value calculated by the reciprocal calculation circuit and the value of the bits stored in the register, to obtain the third value.

9. The entropy code encoder according to claim 1, wherein the fourth arithmetic circuit outputs the value of the lower bits stored in the register as the compressed data stream when the value of the upper bits stored in the register is greater than the first value, and does not output the value of the lower bits stored in the register when the value of the upper bits stored in the register is less than the first value.

10. The entropy code encoder according to claim 1, wherein the compressed data stream is compressed in accordance with a range variant asymmetric numeral system (rANS).

11. A memory system comprising:
a non-volatile semiconductor memory; and
a memory controller including the entropy code encoder according to claim 1, the memory controller configured to compress data to be written into the non-volatile semiconductor memory using the entropy code encoder.

12. An entropy code decoder comprising:
a register;
a plurality of comparator circuits configured to compare cumulative distribution values corresponding to various values of data symbols with lower bits of a value stored in the register, respectively;
a binary encoder circuit configured to output an output symbol as a decompressed data stream based on output values of the comparator circuits; and
an arithmetic circuit configured to:
obtain a first value corresponding to an appearance frequency of the output symbol and a second value corresponding to a cumulative distribution of the first value;
calculate a third value through multiplication of the first value with a bit-shifted value of the value stored in the register and subtraction of the second value therefrom; and
output a fourth value including at least a part of bits of the third value to update the value in the register to the fourth value.

13. The entropy code decoder according to claim 12, wherein
the fourth value is the third value, when a number of bits of the third value is greater than a predetermined number, and
the fourth value is a combination of a bit-shifted value of the third value, which is shifted by the predetermined number, and the predetermined number of bits of an input data stream, when the number of bits of the third value is less than the predetermined number.

14. The entropy code decoder according to claim 12, further comprising:
a first table storing cumulative distribution values corresponding to various values of data symbols,
wherein the arithmetic circuit obtains the second value corresponding to the output symbol by referring to the first table.

15. The entropy code decoder according to claim 14, further comprising:
a second table storing appearance frequency values corresponding to various values of data symbols, and obtains the first value corresponding to the output symbol by referring to the second table.

16. The entropy code decoder according to claim 13, wherein the first arithmetic circuit includes a subtractor circuit configured to calculate a difference of the second value and a second value corresponding to the output symbol plus or minus 1 and calculate the first value based on the difference.

17. The entropy code decoder according to claim 12, wherein the decompressed data stream is decompressed in accordance with a range variant asymmetric numeral system (rANS).

18. A memory system comprising:
a non-volatile semiconductor memory; and
a memory controller including the entropy code decoder according to claim 12, the memory controller configured to decompress data read from the non-volatile semiconductor memory using the entropy code decoder.

19. A compression and decompression circuit comprising:
an entropy code encoder comprising:
a first register;
a first arithmetic circuit configured to output, based on an input symbol, a first value corresponding to an appearance frequency of the input symbol and a second value corresponding to a cumulative distribution of the first value;
a second arithmetic circuit configured to output a third value corresponding to division of a value of bits stored in the first register by the first value;
a third arithmetic circuit configured to output a fourth value obtained by adding the second value to a bit-shifted value of the third value to the register, to update a value of bits stored in the first register to the fourth value; and
a fourth arithmetic circuit configured to compare a value of upper bits stored in the first register and the first value and output lower bits of the value stored in the first register as a compressed data stream in accordance with a comparison result; and an entropy code decoder
a second register;
a plurality of comparator circuits configured to compare cumulative distribution values corresponding to various values of data symbols with a value of lower bits stored in the second register, respectively;
a binary encoder circuit configured to output an output symbol as a decompressed data stream based on output values of the comparator circuits; and
an arithmetic circuit configured to:
obtain a fifth value corresponding to an appearance frequency of the output symbol and a sixth value corresponding to a cumulative distribution of the first value;
calculate a seventh value through multiplication of the fifth value with a bit-shifted value of the value stored in the second register and subtraction of the sixth value therefrom; and
output an eighth value including at least a part of bits of the seventh value to update the value in the second register to the eighth value.

20. A memory system comprising:
a non-volatile semiconductor memory; and
a memory controller including the compression and decompression circuit according to claim 19, the memory controller configured to compress data to be written into the non-volatile semiconductor memory using the entropy code encoder and decompress data read from the non-volatile semiconductor memory using the entropy code decoder.

21. An entropy code decoder comprising:
a register;
a plurality of comparator circuits configured to compare cumulative distribution values corresponding to various even values of data symbols with a value of lower bits stored in the register, respectively;
a binary encoder circuit configured to output an output symbol as at least a part of a decompressed data stream based on output values of the comparator circuits; and
an arithmetic circuit configured to:
obtain a first value corresponding to an appearance frequency of the output symbol and a second value corresponding to an appearance frequency of the output symbol plus 1;
calculate a third value through multiplication of the first value with a bit-shifted value of the value stored in the register and subtraction of a value corresponding to a cumulative distribution of the output symbol and a fourth value through multiplication of the second value with a bit-shifted value of the value stored in the register and subtraction of a value corresponding to a cumulative distribution of the output symbol plus 1;
select one of the third value and the fourth value; and
output a fifth value including at least a part of bits of the selected one of the third and fourth values to update the value in the register to the fifth value.

* * * * *